United States Patent
Carlson et al.

(10) Patent No.: US 9,983,024 B2
(45) Date of Patent: May 29, 2018

(54) DETERMINING A LOAD METER INSTALLATION LOCATION IN AN ENERGY GENERATION SYSTEM

(71) Applicant: SolarCity Corporation, San Mateo, CA (US)

(72) Inventors: Eric Daniel Carlson, San Mateo, CA (US); Trenton John Beals, Hayward, CA (US); Jean Elizabeth Theurer, San Francisco, CA (US)

(73) Assignee: SolarCity Corporation, San Mateo, CA (US)

( * ) Notice: Subject to any disclaimer, the term of this patent is extended or adjusted under 35 U.S.C. 154(b) by 261 days.

(21) Appl. No.: 14/743,727

(22) Filed: Jun. 18, 2015

(65) Prior Publication Data

US 2016/0223602 A1 Aug. 4, 2016

Related U.S. Application Data

(60) Provisional application No. 62/112,041, filed on Feb. 4, 2015.

(51) Int. Cl.
*G01D 4/00* (2006.01)
*G01R 22/06* (2006.01)
(Continued)

(52) U.S. Cl.
CPC .......... *G01D 4/004* (2013.01); *G01R 21/133* (2013.01); *Y02B 90/242* (2013.01); *Y02B 90/248* (2013.01); *Y04S 20/322* (2013.01); *Y04S 20/52* (2013.01)

(58) Field of Classification Search
CPC .......... G01D 4/00; G01D 4/004; G01D 4/006; G01D 4/008
See application file for complete search history.

(56) References Cited

U.S. PATENT DOCUMENTS 6,111,767 A 8/2000 Handleman
8,564,916 B2 10/2013 Kazemi et al.
(Continued)

FOREIGN PATENT DOCUMENTS

CN 103439546 A 12/2013
WO 2011/118627 A1 9/2011
(Continued)

OTHER PUBLICATIONS

Ghali, Fadia M. A. et al., "Fuzzy Photovoltaic System Connected to Distribution Network Radial Line-Voltage Correction, Economic Assessment," Transmission and Distribution Conference and Exhibition 2002: Asia Pacific. IEEE/PES, vol. 3, pp. 1636-1640.
(Continued)

*Primary Examiner* — Christine Enad
(74) *Attorney, Agent, or Firm* — Kilpatrick Townsend & Stockton LLP

(57) ABSTRACT

Certain embodiments include receiving load data from an energy generation (EG) system, where the load data is provided by a load meter, and where the load data corresponds to a predetermined time period. The predetermined time period may be during peak daylight hours (e.g., between 10 A.M. and 2 P.M). The method includes receiving EG data from the EG system, where the EG data corresponds to EG generation by an EG circuit over the predetermined time period, and determining if an inverse relationship exists between the load data and EG data. The method includes determining that the load meter is installed upstream from the EG circuit if an inverse relationship between the load data and EG data exists, and determining that the load mater is installed downstream from the EG circuit if an inverse relationship between the load data and EG data does not exist.

20 Claims, 13 Drawing Sheets

(51) Int. Cl.
*G01R 22/10* (2006.01)
*G01R 21/133* (2006.01)

(56) References Cited

U.S. PATENT DOCUMENTS

| | | | |
|---|---|---|---|
| 9,172,247 | B2 | 10/2015 | Iwasaki et al. |
| 2010/0179704 | A1* | 7/2010 | Ozog ............... G06Q 10/06315 700/291 |
| 2010/0187914 | A1 | 7/2010 | Rada et al. |
| 2010/0207951 | A1 | 8/2010 | Plaisted et al. |
| 2010/0306027 | A1 | 12/2010 | Haugh |
| 2012/0053867 | A1 | 3/2012 | Dunn et al. |
| 2012/0326511 | A1 | 12/2012 | Johnson |
| 2013/0009483 | A1 | 1/2013 | Kawate et al. |
| 2014/0005964 | A1* | 1/2014 | Rouaud ............... G01D 4/00 702/61 |
| 2014/0020244 | A1* | 1/2014 | Carlson ............. H01L 31/02021 29/825 |
| 2014/0025215 | A1* | 1/2014 | Carlson ............... H02J 3/383 700/292 |
| 2014/0210275 | A1 | 7/2014 | Gong et al. |
| 2014/0226365 | A1 | 8/2014 | Oberzaucher et al. |
| 2014/0277811 | A1 | 9/2014 | Dunn et al. |
| 2015/0241482 | A1* | 8/2015 | Sonderegger ........ G01R 19/003 702/65 |
| 2016/0131688 | A1* | 5/2016 | Carlson ................ G01R 21/133 702/61 |

FOREIGN PATENT DOCUMENTS

| | | | |
|---|---|---|---|
| WO | 2013/060604 A2 | 5/2013 | |
| WO | WO 2015120141 A1 * | 8/2015 | .......... B60L 11/1842 |

OTHER PUBLICATIONS

Wang, Xiaowei et al., "Research of Effect on Distribution Network with Penetration of Photovoltaic System," 45th International Universities Power Engineering Conference (UPEC), 2010: United Kingdom, 4 pages.

* cited by examiner

DETERMINING A LOAD METER INSTALLATION LOCATION IN AN ENERGY GENERATION SYSTEM

CROSS REFERENCE TO RELATED APPLICATIONS

The present application claims the benefit of U.S. Provisional Application No. 62/112,041, filed Feb. 4, 2015, which is hereby incorporated by reference in its entirety for all purposes.

BACKGROUND

The present disclosure relates in general to energy generation systems and/or energy consuming systems, and in particular to determining the location of a load meter for monitoring such systems.

In recent years, climate change concerns, federal/state initiatives, and other factors have driven a rapid rise in the installation of renewable energy generation (EG) systems (i.e., systems that generate energy using renewable resources such as solar, wind, hydropower, etc.) at residential and non-residential sites. Solar photovoltaic (PV) systems, in particular, have been very popular EG systems.

Typically, this PV capacity is coupled to the main panel (i.e., main line) and available to power all circuits at the site. Additionally, the PV circuit can be "grid connected" such that any over generation (e.g., PV generation that is greater than the immediate load requirement) can be fed back to the utility through the on-site main panel. This may result in a credit on the site owner's electricity bill and allow the benefits of this energy to be conveyed to others on the grid.

In order to determine how much energy should be provided or credited to a site load, a monitoring device, such as a load meter, is typically installed at a site. For instance, the load meter is installed in an electrical box at a residential site. The load meter continually monitors the energy consumption of the site and/or the PV energy production for a specific period of time. Data generated from the load meter is communicated to a server computer, which uses the data to calculate the amount of energy to be provided or credited to the site load. Proper calculation of such amounts of energy is highly dependent upon whether the server computer knows if the data provided by the load meter takes into consideration the PV energy produced by the PV system.

Whether the data provided by the load meter includes the PV energy produced by the PV system is generally dependent upon the location of its installation relative to the location of the PV system. For instance, the load meter can be installed either upstream or downstream from the PV system. Positioning the load meter upstream from the PV system enables the load meter to measure the net load of the site, i.e., the gross load of the site compensated by the PV energy produced. Alternatively, positioning the load meter downstream from the PV system enables the load meter to measure the gross load of the site, i.e., the site load without any compensation from the PV energy produced. If the server computer does not know that the load meter is measuring only gross load, the server computer may inaccurately calculate energy consumed or produced by the site because it does not account for the PV energy production. An inaccurate calculation can result in an overcharge for excess energy provided, wasted energy, and, ultimately, an increase in cost.

In addition to the problem aforementioned herein, present installation methods do not ensure that the load meter is installed upstream from the PV system. This could be for several reasons. One reason may be that the installation method calls for an indiscriminate placement of the load meter and does not require its location to be recorded. Another reason may be that the electrical box is configured in a way that prevents the load meter from being installed upstream from the PV system, and the electrician forgets the location of the load meter or cannot be located to inform the location of the load meter. In either situation, the location of the load meter is not known and may lead to inaccurate readings.

SUMMARY

A method is utilized for determining the location of a load meter in an energy generation (EG) system (e.g., photovoltaic system) without having to dispatch an operator to perform physical inspection of the load meter. Being able to remotely determine the configuration of a load meter ensures accurate calculations of the site load by knowing whether the load data measured by the load meter is a net load or a gross load. As an example, determining whether the load meter is located upstream from the EG system allows the server (or gateway) computer to know whether the load data measured from the load meter is affected by the EG energy produced from the EG system. If it is determined that the load meter is located downstream from the EG system, the server computer knows that the load meter does not include EG energy produced and can use EG data from by the EG system to compensate the load data measured by the load meter. The server computer may then use this information to correctly measure the net load.

In certain embodiments, the method includes receiving load data from an EG system, where the load data is provided by a load meter, and where the load data corresponds to a predetermined time period. In one non-limiting example, the predetermined time period may be during peak daylight hours, such as between the hours of 10 A.M. and 2 P.M. The method may include receiving EG data from the EG system wherein the EG data corresponds to EG generation by an EG circuit over the predetermined time period. The method may also include determining if an inverse relationship exists between the load data and EG data, determining that the load meter is installed upstream from the EG circuit if an inverse relationship between the load data and EG data exists, and determining that the load mater is installed downstream from the EG circuit if an inverse relationship between the load data and EG data does not exist. An inverse relationship may be determined if a change in EG data corresponds to an opposite change in load data.

In some embodiments, a system includes an EG system to supplement power provided by a utility grid. A main panel may be coupled to the EG system, and a utility meter may be coupled to the main panel and the utility grid. The main panel can include a load meter. The system may further include a control server communicatively coupled to the load meter and the EG system, where the control server has one or more processors configured to receive load data from the EG system, where the load data is provided by a load meter, and where the load data corresponds to a predetermined time period. The one or more processors may receive EG data from the EG system, where the EG data corresponds to EG generation by an EG circuit over the predetermined time period. The one or more processors may further determine if an inverse relationship exists between the load data and EG data, determine that the load meter is installed upstream from the EG circuit if an inverse relationship between the load data and EG data exists, and determine that the load meter is installed downstream from the EG circuit if an inverse relationship between the load data and PV data does not exist. In an embodiment, a site gateway may communicatively couple the control server to both the load meter and the EG system. In some embodiments, the main panel further includes a breaker box, which may be located downstream from the load meter.

In some embodiments, a computer-implemented system includes one or more processors and one or more non-transitory computer-readable storage mediums. The one or more non-transitory computer-readable storage mediums may contain instructions configured to cause the one or more processors to perform operations including receiving load data from an EG system, where the load data is provided by a load meter, and where the load data corresponds to a predetermined time period. The instructions may be configured to receive EG data from the EG system, wherein the EG data corresponds to EG generation by an EG circuit over the predetermined time period. The instructions may be further configured to determine in an inverse relationship exists between the load data and EG data, determine that the load meter is installed upstream from the EG circuit if an inverse relationship between the load data and EG data exists, and determine that the load meter is installed downstream from the EG circuit if an inverse relationship between the load data and EG data does not exist.

DETAILED DESCRIPTION

In the following description, for purposes of explanation, numerous examples and details are set forth in order to provide an understanding of embodiments of the present invention. It will be evident, however, to one skilled in the art that certain embodiments can be practiced without some of these details, or can be practiced with modifications or equivalents thereof.

The present disclosure relates to systems and methods for determining a load meter installation location and configuration in an EG system to accurately determine its net load. In particular, a server computer (or, e.g., a gateway computer) determines whether an inverse relationship exists between data received from a load meter (i.e., load data) and data received from an EG circuit in an EG system (i.e., EG data). If the server computer determines that an inverse relationship does not exist, the server computer may determine that the load meter is downstream from the EG system and that the load data represents a gross load. Alternatively, if the server computer determines that an inverse relationship does exist, the server computer may determine that the load meter is upstream from the EG circuit and that the load data represents a net load.

For purposes of illustration, several of the examples and embodiments that follow are described in the context of EG systems that use solar PV technology for energy generation and battery technology for energy storage. However, it should be appreciated that embodiments of the present invention are not limited to such implementations. For example, in some embodiments, alternative types of energy generation technologies (e.g., wind turbine, solar-thermal, geothermal, biomass, hydropower, etc.) may be used. In other embodiments, alternative types of energy storage technologies (e.g., compressed air, flywheels, pumped hydro, superconducting magnetic energy storage (SMES), etc.) may be used. One of ordinary skill in the art will recognize many modifications, variations, and alternatives.

Figure 1:
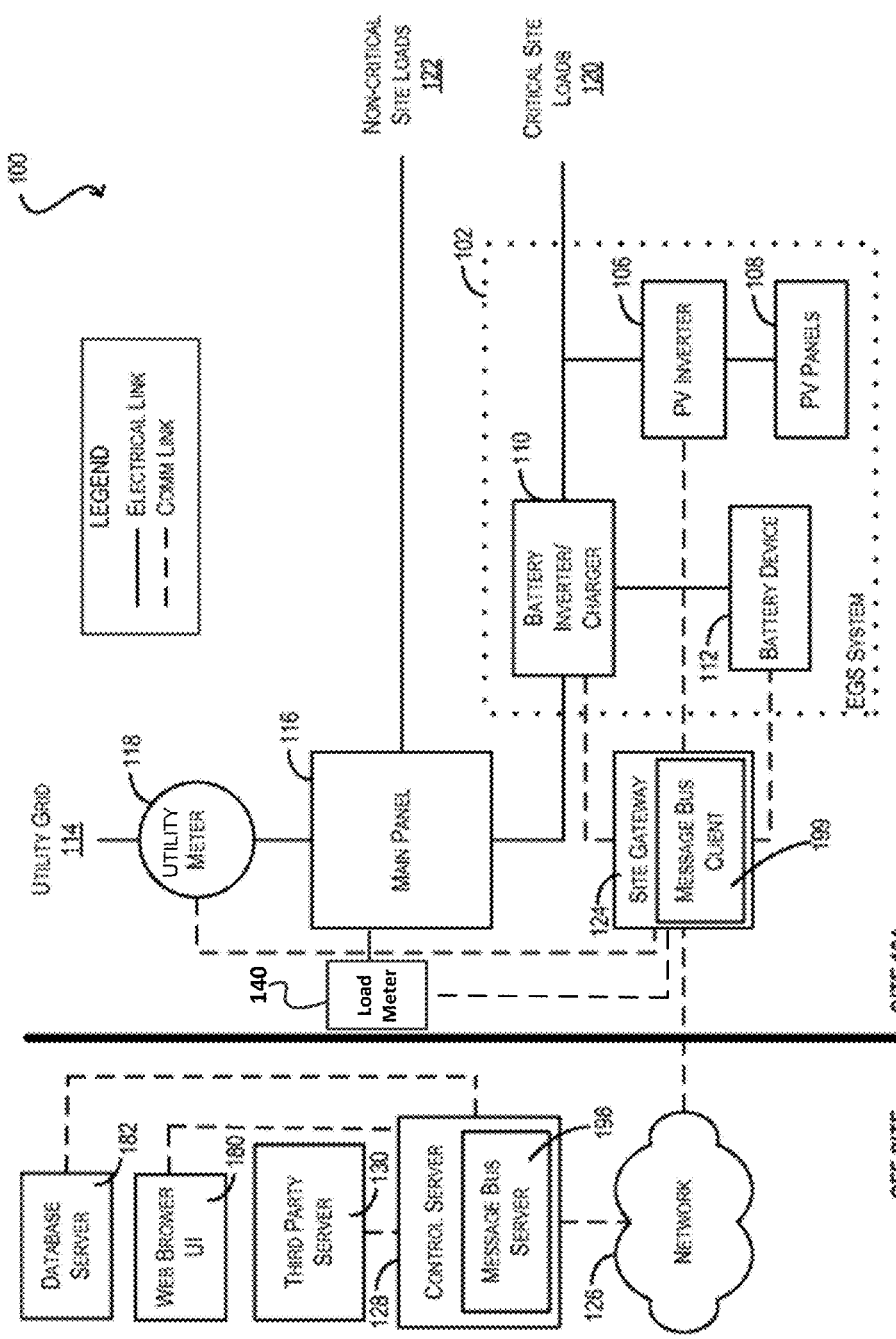
FIG. 1 is a simplified block diagram of a system environment, according to certain embodiments of the invention.

FIG. 1 is a simplified block diagram of a system environment 100 according to an embodiment of the present invention. As shown, system environment 100 includes an energy generation (EG) system 102 that is installed at a site 104 (e.g., a residence, a commercial building, etc.). EG system 102 includes a PV-based energy generation subsystem comprising a PV inverter 106 and one or more PV panels 108, and a battery-based energy storage subsystem comprising a battery inverter/charger 110 and a battery device 112. In some embodiments, PV inverter 106 and battery inverter/charger 110 can be combined into a single device. In the example of FIG. 1, EG system 102 is grid-connected; thus, PV inverter 106 and battery inverter/charger 110 are electrically connected to the main panel. The main panel, in turn, is coupled to the utility grid 114 via utility meter 118. Further, to provide power to site 104, utility grid 114, PV inverter 106, and battery inverter/charger 110 are electrically connected to critical site loads 120 and non-critical site loads 122.

System environment 100 can include a load meter 140 that is electrically connected to the EG system 102 via the main panel 116. Although FIG. 1 illustrates the load meter 140 outside of the main panel 116, embodiments where the load meter 140 is inside of the main panel 116 are envisioned herein as well. In an embodiment, the EG system includes the load meter 140 and the main panel 116. The load meter 140 can be used to measure the magnitude and polarity of power being delivered to and from a load (e.g., loads 120, 122). Load meter 140 is typically located at or near the main panel for convenient access to the main power line, however other configurations are anticipated, as would be appreciated by one of ordinary skill in the art. In embodiments, load meter 140 may be located within the utility meter 118. In alternative embodiments, load meter 140 may be located in an associated subpanel (not shown) located along a line to non-critical site loads 122, or located between main panel 116 and inverter 110. Additionally, embodiments may have multiple load meters, each of which may be configured to operate according to methods disclosed herein. Load meter 140 may be located upstream or downstream from the EG system 102, as will be discussed further herein with respect to FIGS. 2A and 2B.

System environment 100 can include a site gateway 124 and a control server 128. Site gateway 124 may be a computing device (e.g., a general purpose personal computer, a dedicated device, etc.) that is installed at site 104. As shown, site gateway 124 is communicatively coupled with on-site components 106, 110, 112, 118, and 140 (e.g., via a Zigbee network protocol), as well as with control server 128 via a network 126 (e.g., the internet). In one embodiment, site gateway 124 can be a standalone device that is separate from EG system 102. In other embodiments, site gateway 124 can be embedded or integrated into one or more components of system 102. Control server 128 is a server computer (or a cluster/farm of server computers) that is remote from site 104. Control server 128 may be operated by, e.g., the installer or service provider of EG system 102, or some other entity.

In one embodiment, site gateway 124 and control server 128 can carry out various tasks for monitoring the performance of EG system 102. For example, site gateway 124 can collect system operating statistics, such as the amount of PV energy produced (via PV inverter 106), the energy flow to and from utility grid 114 (via utility meter 118), the amount of energy stored in battery device 112, and so on. Site gateway 124 can then send this data to control server 128 for logging and system performance analysis.

Site gateway 124 and control server 128 can operate in tandem to actively facilitate the deployment and control of EG system 102. According to embodiments of the invention, the control server 128 can determine whether the load meter 140 is located upstream or downstream from the EG system 102. The ability to determine the location of the load meter enables the control server 128 to accurately determine the site load, thereby reducing energy waste and an increase in operation cost. Details of this operation is discussed further herein with respect to FIGS. 3A-3B and 4.

FIG. 1 shows other entities remote from the site (OFF SITE), that may communicate with the EG system 102. These other entities include a web server 180 and a database server 182. According to embodiments, communication between the various elements involved in power management (e.g., between the centralized control server and the various devices at the remote site, and/or between the centralized control server 128 and various other remote devices such as the database server, web server, etc.) may be achieved through use of a power management Message Bus System (MBS). In the simplified view of FIG. 1, the MBS is implemented utilizing a message bus server 198, and a message bus client 199 located at the site gateway. In FIG. 1, the message bus server is shown as being on the control server 128, but this is not required and in some embodiments the message bus server could be on a separate machine and/or part of a separate server cluster.

It should be appreciated that system environment 100 is illustrative and not intended to limit embodiments of the present invention. For instance, although FIG. 1 depicts control server 128 as being connected with a single EG system (102) at a single site (104), server 128 can be simultaneously connected with a fleet of EG systems that are distributed at multiple sites. In these embodiments, control server 128 can coordinate the scheduling of these various systems/sites to meet specific goals or objectives. In further embodiments, the various components depicted in system 100 can have other capabilities or include other subcomponents that are not specifically described. Furthermore, multiple instances and variants of the control server may exist, each communicating with one or more other control servers, EG systems and/or other devices connected to the MBS. Further still, some embodiments may use a different communication infrastructure. One of ordinary skill in the art will recognize many variations, modifications, and alternatives.

Load Meter

Figure 2A:
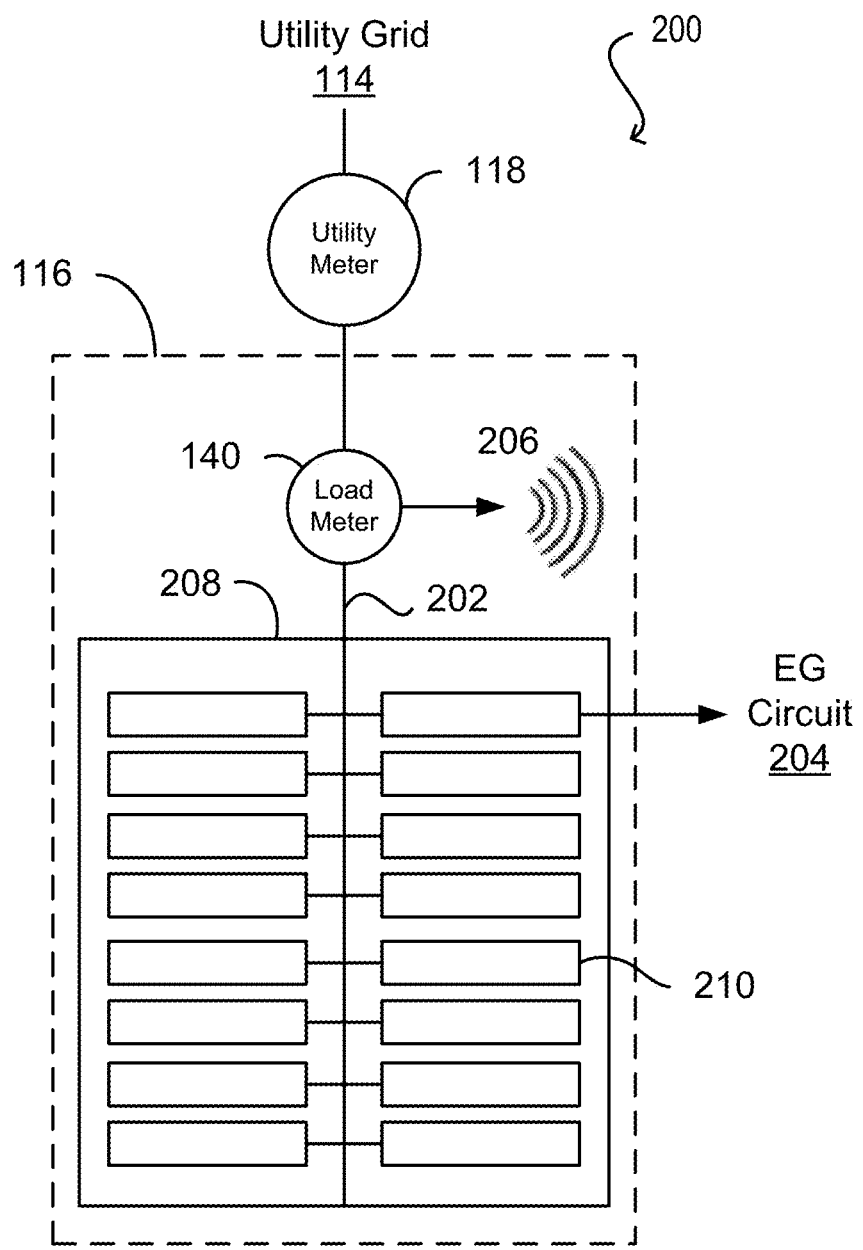
FIG. 2A is a simplified diagram of connections for a main panel in a power system where a load meter is located upstream from an EG circuit, according to certain embodiments of the invention.
Figure 2B:
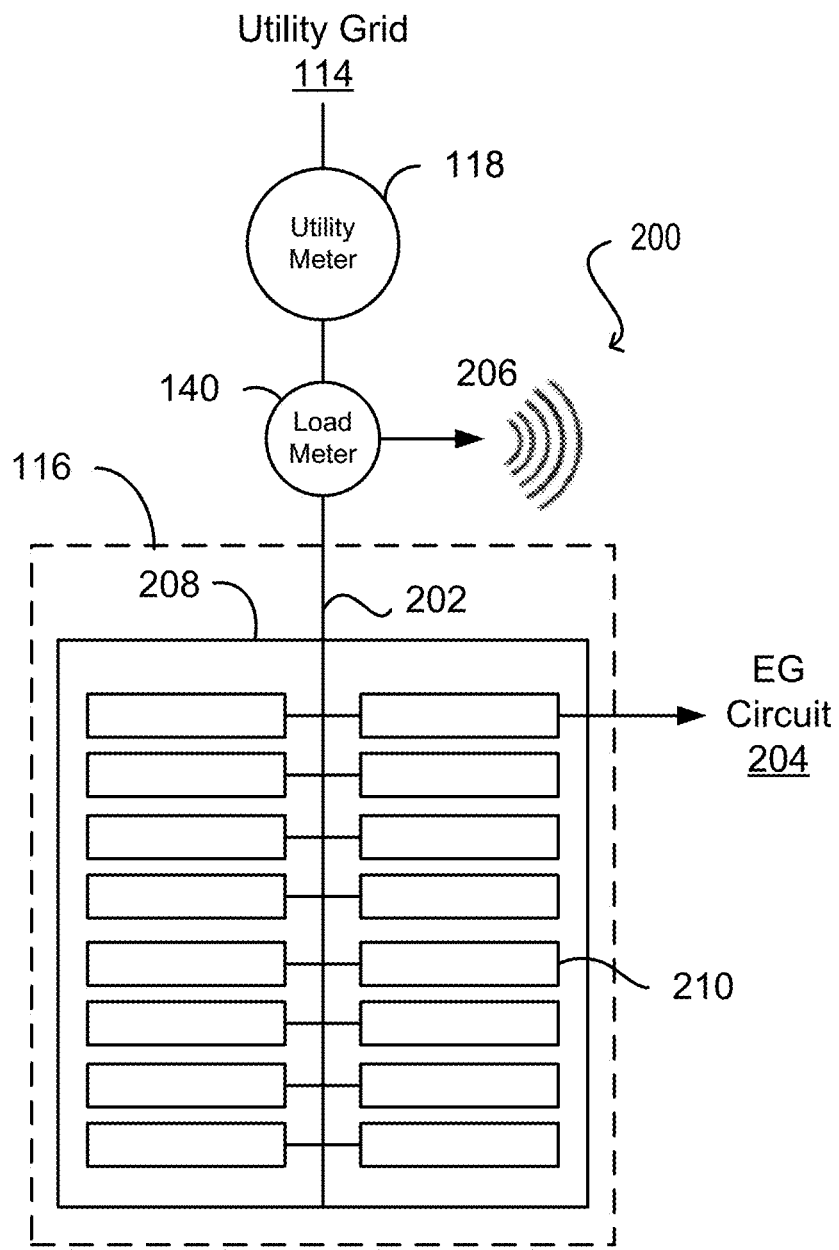
FIG. 2B is a simplified diagram of connections for a main panel in a power system where a load meter is located outside of the main panel and upstream from an EG circuit, according to certain embodiments of the invention.

Additional details regarding embodiments of a power system 200 implementing a load meter 140 are now described with respect to FIGS. 2A and 2B. The load meter 140 can be used to measure the magnitude of power and current being delivered to a load. For example, during periods of peak power requirements, some sites that do not have an EG system may draw more power from the utility grid than other sites that do have an EG system. Because the EG system generates energy, the amount of power drawn during this period of time may be compensated, i.e., decreased, by energy generated from the EG system. That is, the magnitude of power being delivered to a load may be less for a site that has an EG system compared to a site that does not.

In some implementations, the load meter measures the power being delivered to the load (e.g., at the main panel) and can wirelessly transmits 206 the collected data to a local site gateway. This can provide users with remote access and smart metering capabilities. However, the load meter is often installed downstream from an EG system unbeknownst to a server computer, resulting in incorrect calculation of site load by the server computer. In the past, these errors typically required a maintenance worker to visit the premises and physically determine whether the load meter was positioned to measure the correct load. Now, certain embodiments of the present invention provide systems and methods to remotely determine the location of the load meter, and if necessary, manipulate incoming data to ensure a correct calculation of the site load regardless of the location of the load meter.

Embodiments of the invention relate to measuring load data from a load meter and EG data from an EG circuit. By measuring the load data and the EG data, the load data may be compared to the EG data to determine whether a relationship exists between the two data trends. If an inverse correlation exists between the load data and EG data, then it may be determined that the load meter is located upstream from the EG circuit. In contrast, if an inverse correlation does not exist between the load data and EG data, then it may be determined that the load meter is located downstream from the EG circuit. Accordingly, EG data may be used to compensate the measured load data to accurately calculate site load. This process can be performed remotely without requiring any physical changes to the on-site hardware configuration. It should be appreciated that scaling this process over thousands of PV systems can save considerable time, man power, and resources.

FIG. 2A is a simplified diagram of a power system 200 including a main panel 116 and a load meter 140, according to certain embodiments of the invention. The load meter 140 is typically coupled to a main power line 202 in a location housed by the main panel 116. Power line 202 allows power to flow from the utility grid 118 into the main panel 116. Although FIG. 2A illustrates the load meter 140 as being housed within the main panel 116, other embodiments where the load meter 140 is located outside of the main panel 116 are envisioned herein as well. Main panel 116 is connected to the utility grid 114 through utility meter 118.

Main panel 116 may include a main disconnect switch (not shown), breaker box 208, and a power bus (not shown). The power bus can be an arrangement of gauges of wires that power any suitable load, such as loads 120 and 122. Although it is not explicitly illustrated, main panel 116 can be connected to an EG system (e.g., a PV-based power system), such as EG system 102 of FIG. 1. Thus, power can come into the system 200 via the utility grid 114 as well as the EG system (e.g., PV system) from the EG circuit 204.

A load meter 140 can be coupled to the power line 202 to measure a power supplied to the main panel 116. The measured power may correspond to the site load. The load meter 140 may be any suitable indirect measurement device such that the power line 202 is not physically spliced. This eliminates the need to directly place a meter in-line with the main, which is generally not favored. In an embodiment, the load meter 140 uses a current transducer (CT) that indirectly monitors main line power to measure the current running through the power line 202. Load meter 140 may measure power supplied to loads located downstream from the load meter 140. For instance, the load meter 140 may measure power supplied to loads 120 and 122, which may be any suitable load capable of drawing power, such as household appliances and lights. In such situations, load meter 140 is located upstream from the loads 120 and 122. Thus, the load meter 140 can measure the total power supplied to the loads 120 and 122.

As illustrated in FIG. 2A, the load meter 140 may be installed in the main panel 116. Installing the load meter 140 inside the main panel 116 may allow the load meter 140 to be better protected from the environment. Additionally, the power system 200 may be more compact as there are less components disposed outside of the main panel 116. However, installing the load meter 140 inside of the main panel 116 may make it more difficult to access for servicing purposes. Thus, as shown in FIG. 2B, the load meter 140 may be installed outside of the main panel 116. In some embodiments, the load meter 140 may be installed downstream of the utility meter 118 and upstream of the main panel 116.

Figure 2C:
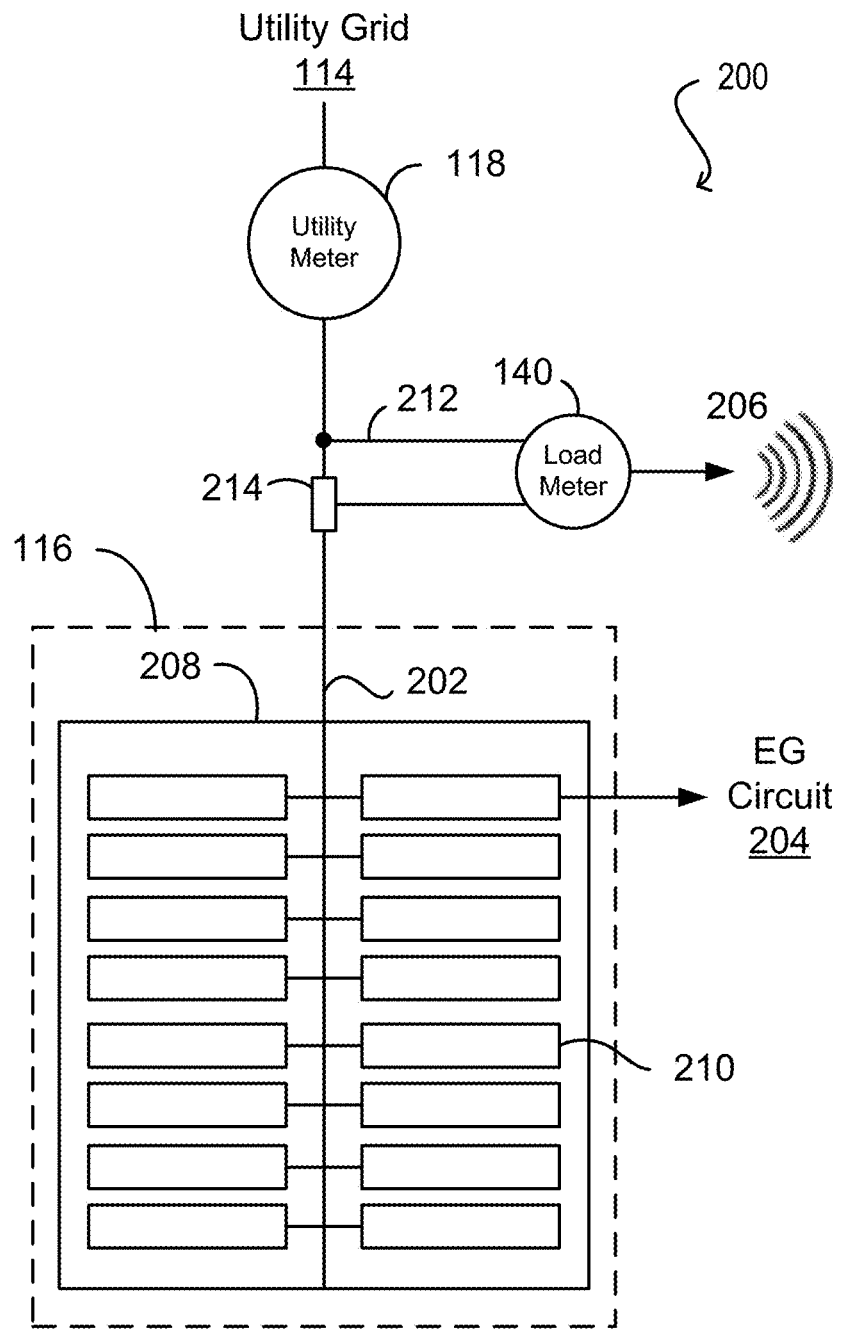
FIG. 2C is a simplified diagram of connections for a main panel in a power system where a load meter is located upstream from an EG circuit and is coupled to a main power line via a voltage tap and a current transducer, according to certain embodiments of the invention.

In addition to embodiments where load meter 140 is directly installed on the main power line 202 as discussed in FIGS. 2A and 2B, other embodiments may be configured to have load meter 140 installed off of the main power line 202 as illustrated in FIG. 2C. FIG. 2C illustrates load meter 140 coupled to the main power line 202. Load meter 140 may be coupled to the main power line 202 by directly tapping into the main power line 202 and/or indirectly sensing the main power line 202 without directly tapping into it. For instance, as shown in FIG. 2C, load meter 140 may be coupled to the main power line 202 via a voltage tap 212 and a current transducer 214. Voltage tap 212 may directly tap into the main power line 202 by any suitable method, such as splicing. In embodiments, voltage tap 212 senses voltage drawn by the main panel 116 from the main power line 202. Current transducer 214 may not directly tap into the main power line 202. Instead, current transducer 214 may indirectly sense the main power line 202 by detecting magnetic fields generated by current flow through the main power line 202. In embodiments, current transducer 214 may be a coil of wire that wraps around the main power line 202 without actually touching the main power line 202. Accordingly, load meter 140 may measure power utilized by the main panel 116 through the main power line 202.

In embodiments, an EG circuit 204 can be coupled to main panel 116. The EG circuit 204 may be part of an EG system, such as EG system 102. For instance, the EG circuit 204 may include a PV inverter 106 as illustrated in FIG. 1. The EG circuit 204 can be coupled to main panel 116 via the breaker box 208. Accordingly, in such situations, the load meter 140 is located upstream from the EG circuit 204. This upstream configuration allows the load meter 140 to measure the energy consumption of the loads 120 and 122, as well as the energy production of the EG system 102. Accordingly, the load meter 140 measures a net load of the site, meaning the combined amount of power provided to loads 120 and 122 after taking into consideration the amount of energy provided by the EG system 102.

Figure 2D:
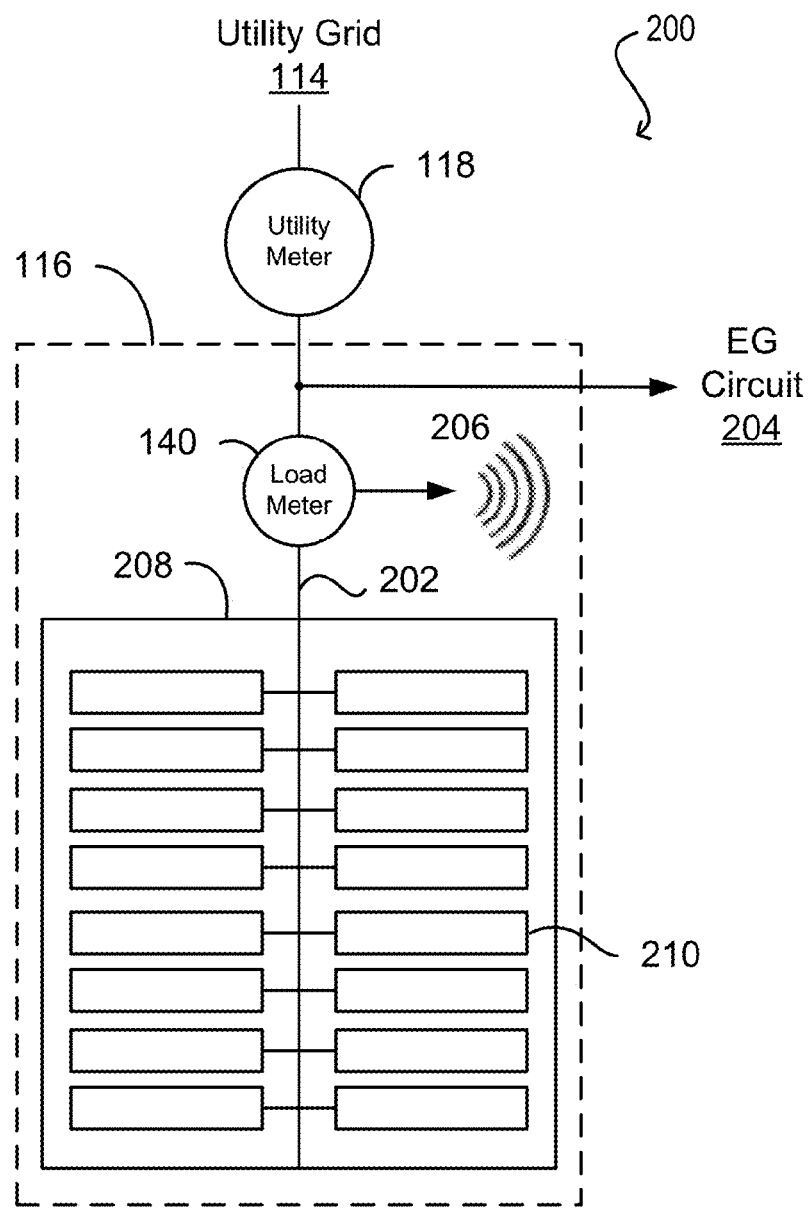
FIG. 2D is a simplified diagram of connections for a main panel in a power system where a load meter is located downstream from an EG circuit, according to certain embodiments of the invention.

Although FIGS. 2A-2C illustrate embodiments where the load meter 140 is upstream from the EG circuit 204, the load meter 140 can be installed such that it is located downstream from the EG circuit 204 in an alternative embodiment. FIG. 2D is a simplified diagram that illustrates an exemplary embodiment where the load meter 140 is located downstream from the EG circuit 204. As shown, the EG circuit 204 may couple to the power line 202 in the breaker box 208 above the load meter 140. Because the load meter 140 is located downstream from the EG circuit 204, power generated by the EG system 102 cannot be measured by the load meter 140. Thus, regardless of how much power the EG system 102 is generating, the load meter 140 measures the site load and does not take into consideration the amount of power generated by the EG system 102. If a server computer, such as control server 128, does not know whether the load meter 140 is located upstream or downstream from the EG circuit 204, the server computer may erroneously assume that the measurements read by the load meter 140 include energy generated by the EG system 102 in a downstream configuration.

Correlation of Data

The measurements read by the load meter 140 may be provided to a server computer as load data. This data may be received by the server computer and compared to EG data provided by the EG circuit 204. EG data may correspond to the amount of energy generated by the EG circuit 102. According to embodiments of the invention, the server computer may compare the load data with the EG data and determine the location of the load meter 140. Accordingly, the server computer may determine whether the load meter 140 is upstream or downstream from the EG circuit 204, and alter the load data if it is determined that the load meter 140 is downstream from the EG circuit 204. In an embodiment, the server computer makes this determination based on trends of load data and EG data, as shown in FIGS. 3A and 3B.

Figure 3A:
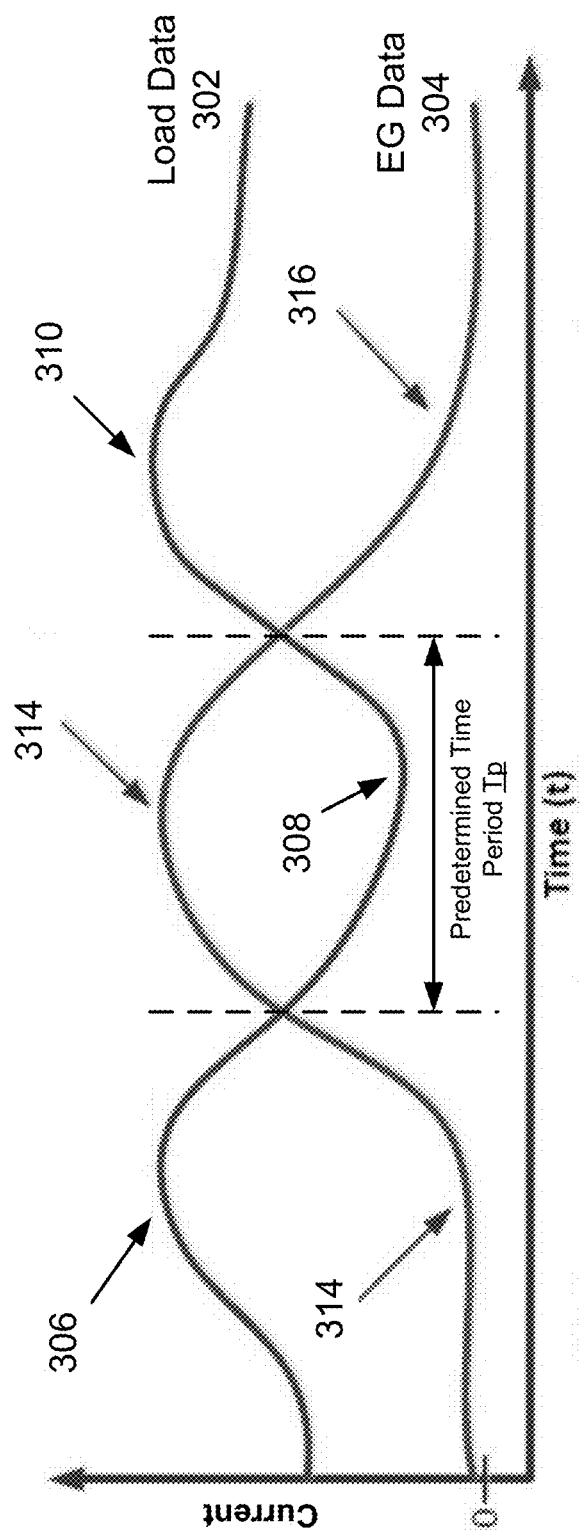
FIG. 3A is a chart plot of load data and EG data for a load meter located upstream from an EG circuit, according to certain embodiments of the invention.
Figure 3B:
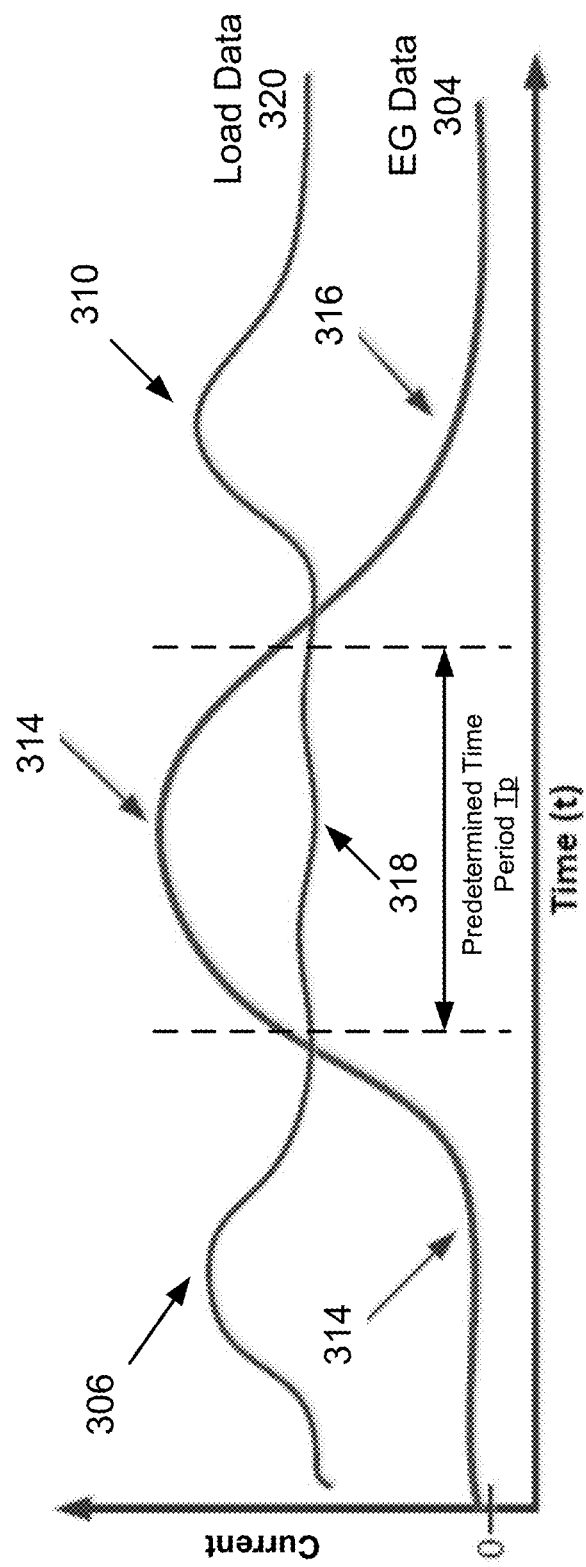
FIG. 3B is a chart plot of load data and EG data for a load meter located downstream from an EG circuit, according to certain embodiments of the invention.

FIG. 3A illustrates a chart plot of load data 302 and EG data 304 for the load meter 140 located upstream from the EG circuit 204, as previously shown in FIG. 2A. The chart plot includes superimposed trends of load data 302 and EG data 304 for any suitable load site, such as, but not limited to, a residential site. The chart plot has a vertical axis indicating an increasing absolute magnitude of power and a horizontal axis indicating an increasing progression of time.

In a typical residential site, EG data 304 has a profile that includes one peak 314 surrounded by a relatively flat trend. This profile may correspond to the amount of power generated by an EG system, such as a PV system. The amount of power generated by the EG system may be directly correlated with the amount of sunlight produced in a normal, e.g., sunny, day at the residential site. As an example, there may be little to no sunlight in the very early mornings, followed by the sunrise represented by region 312, which begins an increase in power generation to the peak 314 where power production is greatest (i.e., in the middle of the day). Thereafter, the power generation decreases as the sun begins to set until sunset at region 314 when there is no longer any power generation by the PV system due to a lack of sunlight.

In contrast to the EG data 304, the load data 302 may have a different profile. In an embodiment, the load data 302 has a dip 308 and two peaks: first peak 306 and second peak 310. The first peak 306 may be caused by an increase in load early in the morning. For instance, the first peak 306 may represent when a family wakes up and begins its morning routine by turning on lights or running household appliances, such as a coffee maker and/or a television set, that draw a certain amount of power from the utility grid 114. As the day progresses, the load data 302 may begin to decrease as shown by the dip 308. During this time period, the family may have left the residential site for work and/or school. Accordingly, lights and household appliances are not being used and thus draw little to no power. Although no one is home, load data 302 may not decrease to zero power consumption because passive household machinery, such as the heater or air conditioner, may still be periodically running to maintain the temperature of the residence. As the day progresses further, the family may return and turn on lights and run appliances once again, thereby creating the second peak 310.

When the load meter 140 is located upstream from the EG circuit 204, load data 302 may represent net load as measured by the load meter 140. The load data 302 may have a dip 308. When the EG system 102 generates power for the residential site, less power is needed from the utility grid. The dip 308 can be attributed to an increase in power production from the EG system 102, which causes a corresponding decrease of power supplied by the utility grid 114. The dip 308 may reach a lower point than the dip 318, which corresponds to an embodiment where the load meter 140 is located downstream from the EG circuit 204. Load data 320 measured in this downstream configuration is illustrated in FIG. 3B. The dip 318 in FIG. 3B has a roughly horizontal trend that does not change as dramatically as the dip 308 shown in FIG. 3A. Power consumption at dip 308 for an upstream configuration is therefore less than the power consumption at dip 318 for a downstream configuration.

When the load meter 140 is located upstream from the EG circuit 204, a correlation can be observed between load data 302 and EG data 304. For instance, load data 302 and EG data 304 may have an inverse relationship. The inverse relationship may exist when a change in EG data 304 corresponds to an opposite change in load data 302. For example, an increase in EG data 304 may correspond to a decrease in load data 302. In embodiments, a correlation coefficient may be calculated to measure the degree of correlation between the load data 302 and EG data 304. The correlation coefficient may be calculated by computing the correlation between load data and EG data. When the correlation coefficient is substantially high, it may be determined that the measured load data is net load. In certain embodiments, correlation coefficients greater than 0.95 may indicate that the measured load data is net load. One skilled in the art understands that 0.95 is merely an exemplary threshold value that may vary depending on algorithm design, and that such a value does not limit other embodiments with lower threshold values. However, when the load meter 140 is located downstream from the EG circuit 204, no correlation can be observed between load data 320 and EG data 304. In other words, a change in load data 320 does not correspond to a change in EG data 304. This is because the power measured by the load meter does not take into account the power generated by the EG circuit 204. Accordingly, a correlation coefficient that is substantially low may indicate that the measured load is gross load and does not take into account EG data 304. In embodiments, correlation coefficients less than 0.3 may indicate that the measured load data is gross load.

The inverse relationship may be specifically observed during a predetermined time period, such as when the EG data 304 is substantially high. For instance, the predetermined time period may be during the time of day when the sun is typically at its brightest (i.e., midday). In an embodiment, the predetermined time period is between the hours of 10 A.M. and 2 P.M. It is to be appreciated that any other time period where the sun may be sufficiently bright may be included in the predetermined time period.

Determination of Load Meter Location

According to embodiments of the invention, a method may be utilized to take advantage of the existence of a correlation between load data and EG data to determine whether the load meter is located upstream or downstream from the EG circuit. One exemplary method is illustrated in FIG. 4.

Figure 4:
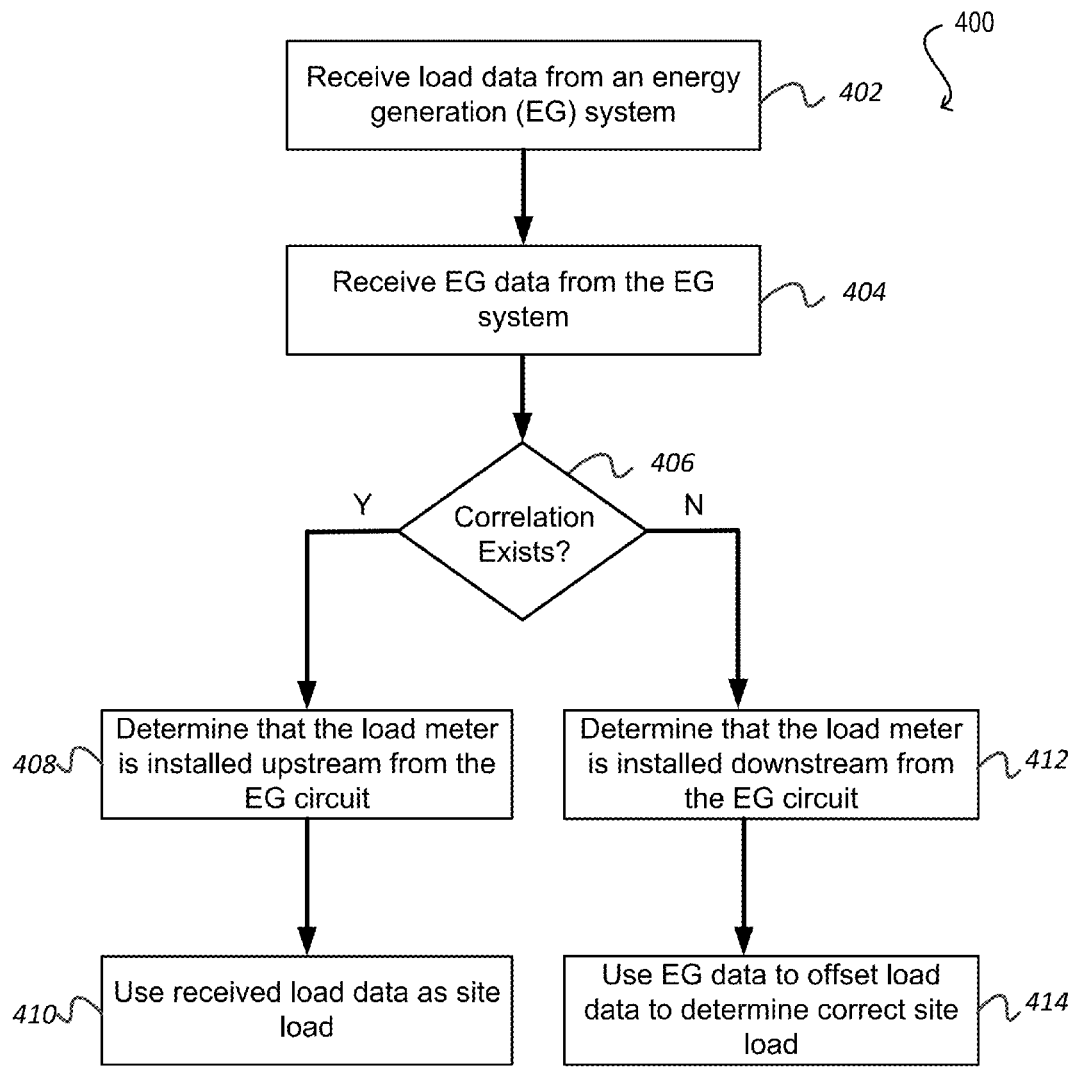
FIG. 4 is a simplified flow chart of a method for determining a load meter installation location in an EG system, according to certain embodiments of the invention.

FIG. 4 is a simplified flow chart for a method 400 of determining a location of a load meter in an EG system, according to certain embodiments of the invention. Method 400 can be performed by processing logic that may comprise hardware (circuitry, dedicated logic, etc.), software (such as is run on a general purpose computing system or a dedicated machine), firmware (embedded software), or any combination thereof. In one embodiment, method 400 can be performed by a processor on control server 128, site gateway 124, or other suitable computing device.

At step 402, method 400 includes receiving load data from an EG system. The load data can be provided by a load meter. Additionally, the load data can correspond to a predetermined time period. In one non-limiting example, the predetermined time period can be between the hours of 10 A.M. and 2 P.M., although other time periods during daylight hours are possible.

At step 404, method 400 further includes receiving EG data from the EG system. The EG data may correspond to EG generation by an EG circuit over the predetermined time period. At step 406, the load data may be compared to the EG data to determine whether a correlation exists. A correlation may exist when a change in EG data corresponds to an opposite change in load data, e.g., when an inverse relationship exists. In such embodiments, a calculated correlation coefficient may be greater than 0.95.

If a correlation exists during the predetermined time period, then, at step 408, it may be determined that the load meter is installed upstream from the EG circuit. Accordingly, at step 410, the received load data may be used as net load without alteration. If a correlation does not exist during the predetermined time period, however, then, at step 412, it may be determined that the load meter is installed downstream from the EG circuit. In this case, at step 414, the received EG data may be used to compensate the received load data to account for the energy generated by the EG circuit in order to calculate net load, i.e., actual load used by the site.

It should be appreciated that the specific steps illustrated in FIG. 4 provide a particular method 400 of determining a load meter installation location in an EG system, according to certain embodiments of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the method 400.

Determining Existence of a Correlation

Figure 5:
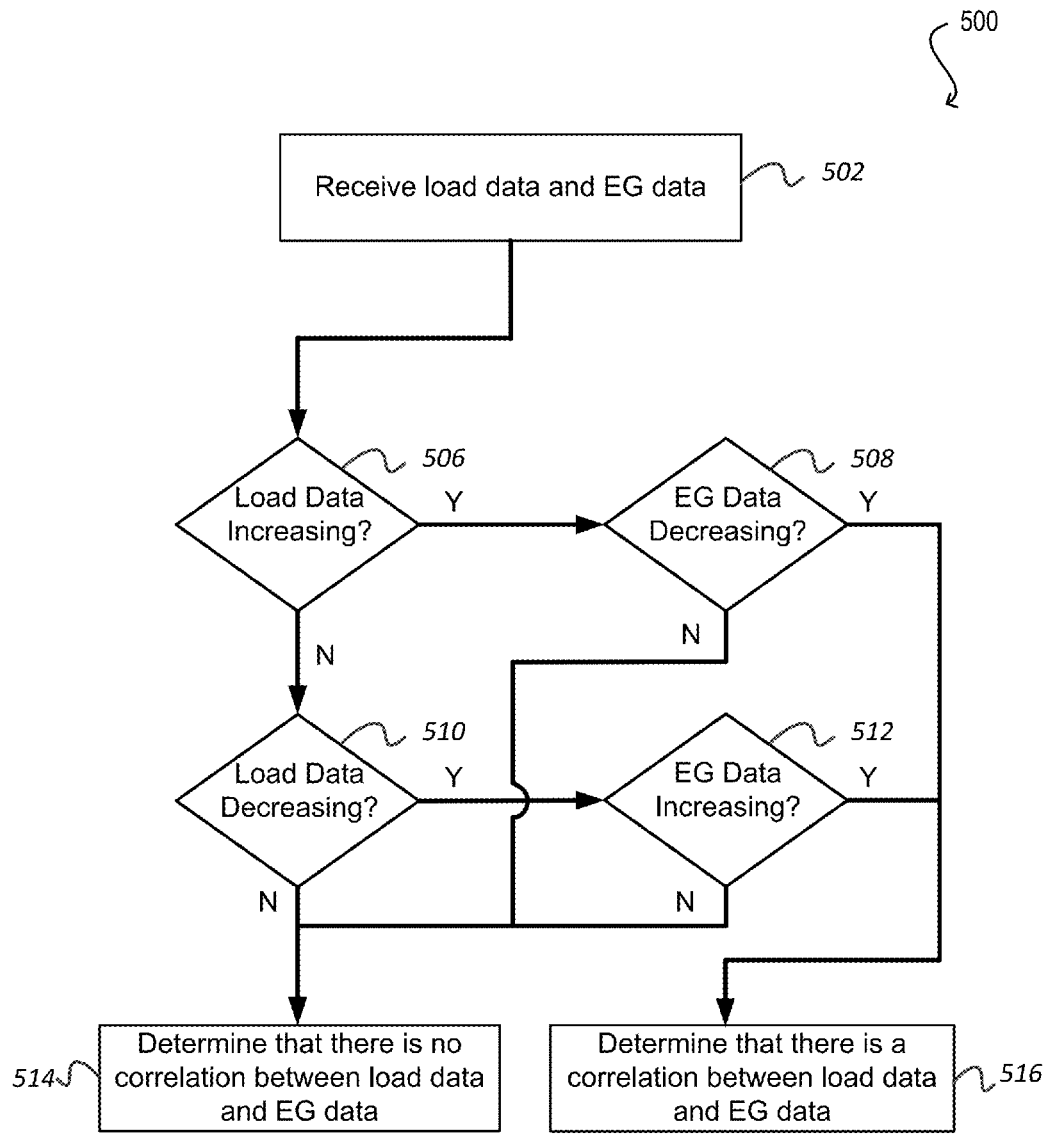
FIG. 5 is a simplified flow chart of a method for determining a load meter installation location in an EG system by looking at the trend of the load and EG data, according to certain embodiments of the invention.

FIG. 5 is a flow chart illustrating a method 500 of determining an existence of a correlation between load data and EG data by looking at the trend of both the load and EG data. Method 500 can be performed by processing logic that may comprise hardware (circuitry, dedicated logic, etc.), software (such as is run on a general purpose computing system or a dedicated machine), firmware (embedded software), or any combination thereof. In one embodiment, method 500 can be performed by a processor on control server 128, site gateway 124, or other suitable computing device.

At block 502, method 500 includes receiving load data and EG data from an EG system. The load data can be provided by a load meter. The EG data may correspond to EG generation by an EG circuit over the predetermined time period. Block 502 may be similar to blocks 402 and 404 discussed herein with respect to FIG. 4.

At block 506, it may be determined whether the load data has an increasing trend. If the load data is increasing, then at block 508, it may be determined whether the EG data is decreasing. If the EG data is determined to be decreasing, then at block 516, it can be determined that there is a correlation between the load data and EG data because the trend of load data is opposite of the trend of the EG data. If, however, the EG data is not decreasing, then it may be determined that there is no correlation between the load data and EG data at block 514.

If, at block 506, it is determined that the load data is not increasing, then at block 510, it may be determined whether the load data is decreasing. If the load data is decreasing, then it may be determined whether the EG data is increasing at block 512. If the EG data is increasing, then at block 516, it can be determined that there is a correlation between the load data and EG data. However, if the EG data is not increasing, then it can be determined that there is no correlation between the load data and EG data at block 514.

If, at block 510, it is determined that the load data is not decreasing, then it can be concluded that the load data is not increasing or decreasing, e.g., staying constant. In this case, it can be determined that there is no correlation between load data and EG data. As discussed herein, when a correlation exists, a calculated correlation coefficient may be greater than 0.95. When no correlation exists, a calculated correlation coefficient may be less than 0.3.

Determining Trend for Determining Inverse Relationship

Figure 6:
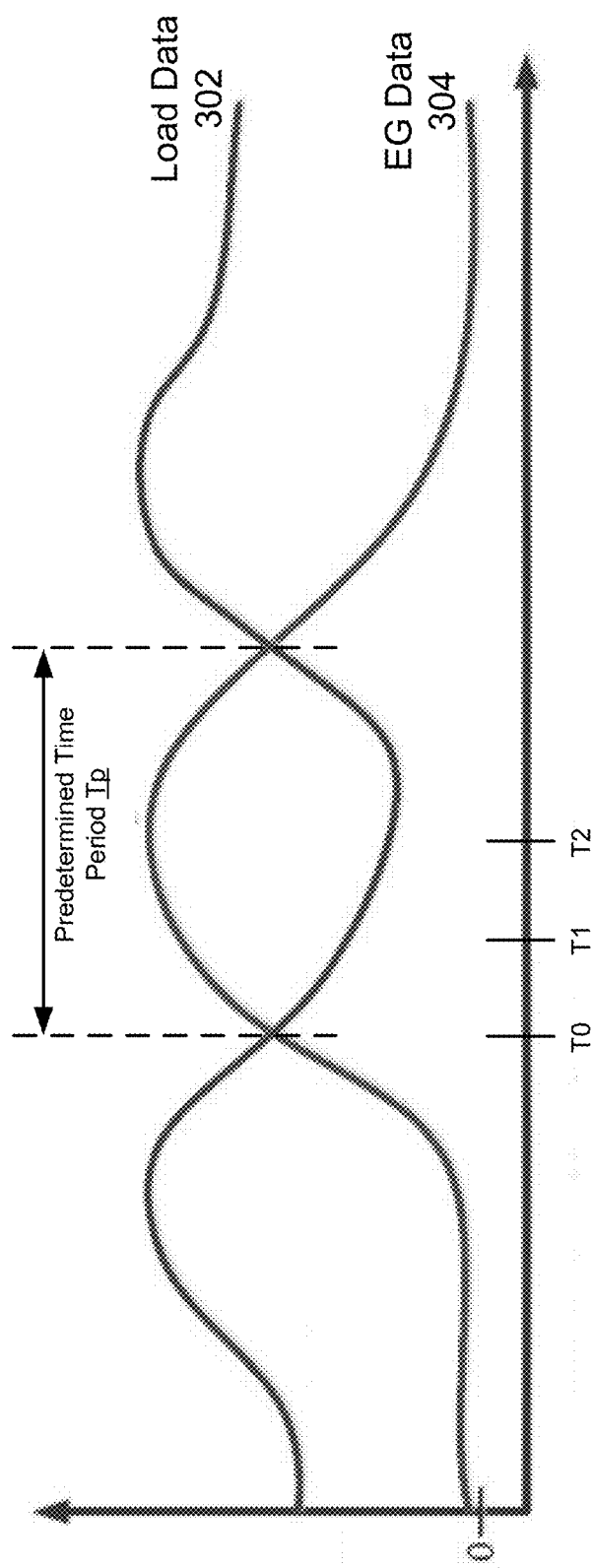
FIG. 6 is a chart plot of load data and EG data with illustrated sampling time periods, according to certain embodiments of the invention.
Figure 7:
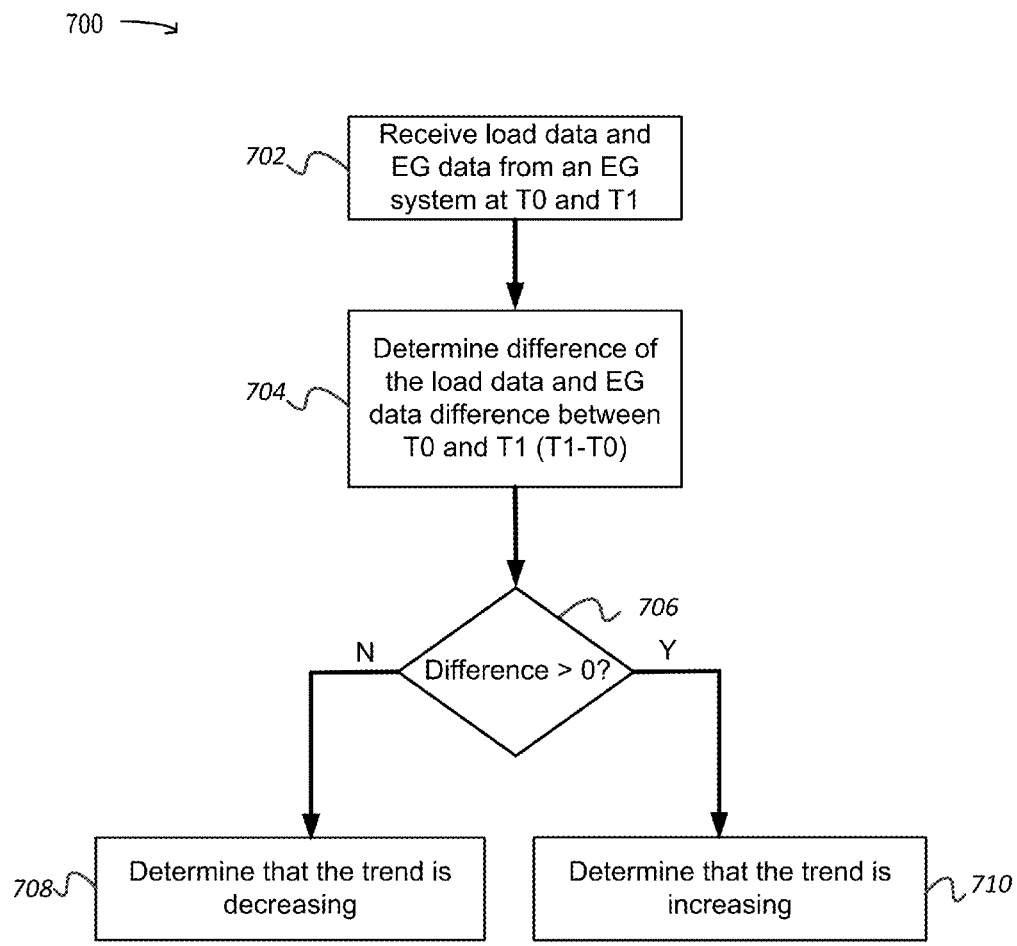
FIG. 7 is a simplified flow chart of a method for determining a load meter installation location in an EG system by looking at the difference of the load and EG data at different time intervals, according to certain embodiments of the invention.
Figure 8:
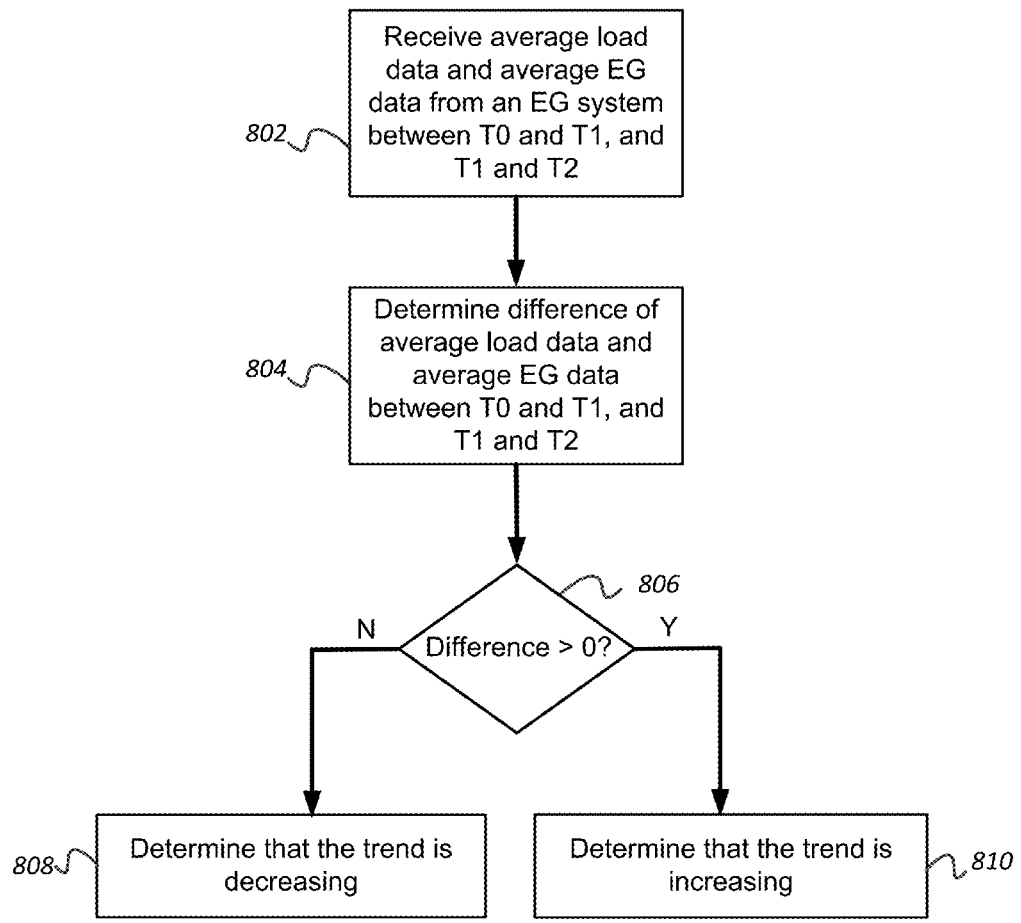
FIG. 8 is a simplified flow chart of a method for determining a load meter installation location in an EG system by looking at the difference of the average load and EG data across different time intervals, according to certain embodiments of the invention.

Details of how the trend is determined is discussed herein with respect to FIGS. 6-8. Specifically, FIG. 6 illustrates a chart plot having exemplary time periods used for determining a trend of load data 302 and EG data 304. FIG. 7 is a flow chart illustrating a method of determining a trend of load data and/or EG data by determining a difference of the load data and EG data. FIG. 8 is a flow chart illustrating a method of determining a trend of load data and/or EG data by determining a difference of the average load data and average EG data.

As illustrated in FIG. 6, determining a trend of load data 302 and EG data 304 may include sampling the instantaneous load and EG generation at certain sampling times. For instance, the load data 302 and EG data 304 may be sampled at time T0, T1, and T2. T0 may correspond to the very beginning of the predetermined time period Tp. T1 and T2 may occur at any suitable predetermined intervals of time after T0. As an example. T1 and T2 may occur at subsequent intervals of 5 minutes such that if T0 is at 10:00 am, then T1 may be at 10:05 am and T2 may be at 10:10 am. Other embodiments where the intervals are greater or less than 5 minutes are envisioned herein.

Sampling the load data 302 and EG data 304 at predetermined intervals of time larger than one minute may be suitable for a rolling average of load data 302 and EG data 304. A rolling average has a smoother trend with less fluctuation, as shown in FIG. 6. However, if the load data 302 and EG data 304 are not rolling averages, but are true instantaneous readings, then the load data 302 and EG data 304 may be more jagged (not shown). Accordingly, a sampled average across a period of time may be more useful in determining a sample of the load data 302 and EG data 304, especially when the sampling rate is high (e.g., every 15 seconds), which will be discussed further herein with respect to FIG. 8.

The sampling of load data 302 and EG data 304 may be used to determine whether the trend is increasing or decreasing as discussed further herein with respect to FIGS. 7 and 8. In FIG. 7, the method 700 for determining whether a trend is increasing or decreasing begins by receiving load data and EG data from an EG system at T0 and T1 at block 702. The method 700 may be particularly useful when the sampling rate is greater than one sample per minute, such as a sampling rate of one sample per 5 or 15 minutes.

At block 704, the difference of T0 and T1 for each data sampled may be determined. For instance, the difference between the samples of load data at T1 and T0, and the difference between the samples of EG data at T1 and T0 may be determined. In certain embodiments, the earlier sampled data is subtracted from the later sampled data, i.e., T0 subtracted from T1. Thereafter, at block 706, it is determined whether the difference between T0 and T1 is greater than 0. If the difference between T0 and T1 is greater than 0 then, at block 710, it can be determined that there is an increasing trend because the data is larger at a later time. On the other hand, if the difference is negative, then, at block 708, it can be determined that there is a decreasing trend.

Another way of determining whether a trend is increasing or decreasing is illustrated in the flow chart of FIG. 8. Method 800 in FIG. 8 determines whether a trend is decreasing or increasing by determining the difference of averaged data samples across a period of time. This particular method may be useful when the sampling rate is high, e.g., one sample every less than one minute, such as one sample every 5 to 15 seconds.

Method 800 begins by receiving average load data and average EG data from an EG system at block 802. That is, the average load data and average EG data may be determined by the average of the load data and EG data across T0 and T1, and T1 and T2. By averaging the load data and EG data across a time period, the fluctuation from the instantaneous readings may be eliminated.

At block 804, the average load data between T0 and T1 may be subtracted from the average load data between T1 and T2. Similarly, the average EG data between T0 and T1 may be subtracted from the average EG data between T1 and T2. If, at block 806, it is determined that the difference is greater than 0, then it can be determined that the trend is increasing at block 810. On the other hand, if, at block 806, it is determined that the difference is less than 0, then it can be determined that the trend is decreasing at block 808.

Although FIGS. 6-8 illustrate only three sampling times T0, T1, and T2, embodiments are not so limited. There may be more or less than three sampling times in alternative embodiments depending on algorithm design.

System Architectures

Figure 9:
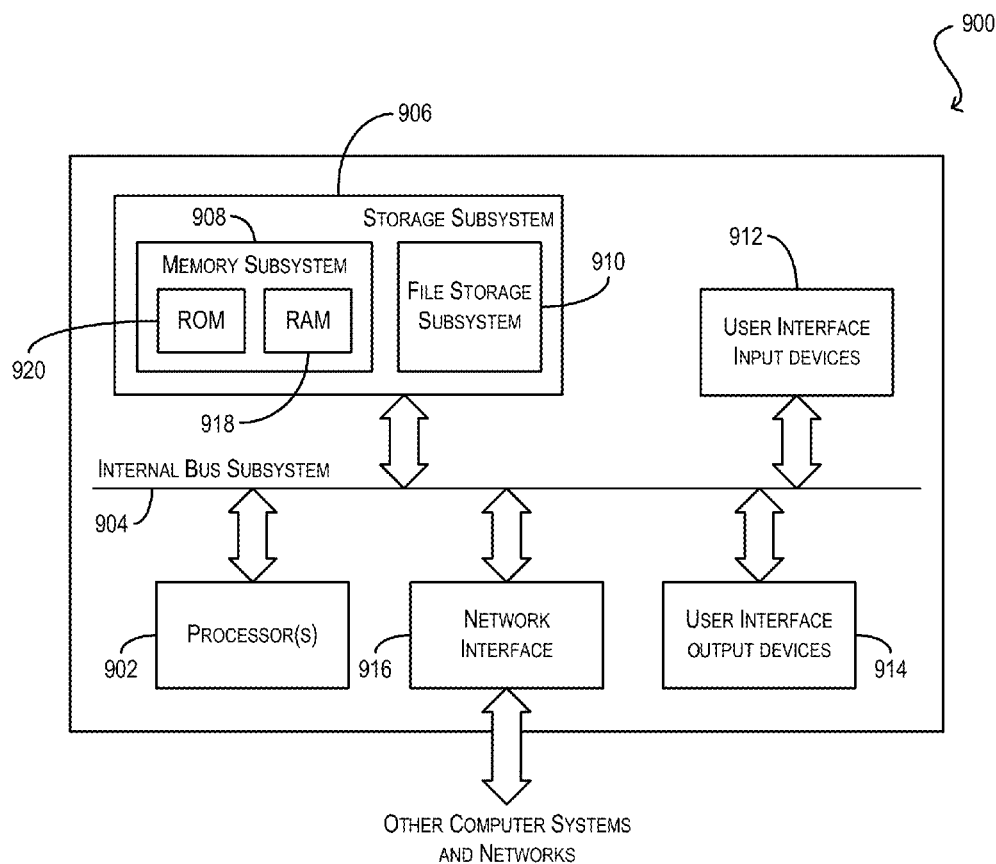
FIG. 9 is a simplified block diagram of a computer system, according to certain embodiments of the invention.

FIG. 9 is a simplified block diagram of a computer system 900 according to an embodiment of the present invention. Computer system 900 can be used to implement any of the computer systems/devices (e.g., site gateway 124 and/or control server 128) described with respect to FIG. 1. As shown in FIG. 9, computer system 900 can include one or more processors 902 that communicate with a number of peripheral devices via a bus subsystem 904. These peripheral devices can include a storage subsystem 906 (comprising a memory subsystem 908 and a file storage subsystem 910), user interface input devices 912, user interface output devices 914, and a network interface subsystem 916. The memory in subsystem 908 may contain instructions configured to cause the one or more processors to perform operations, such as determining the installation location of a load meter, according to embodiments of the present invention.

Internal bus subsystem 904 can provide a mechanism for letting the various components and subsystems of computer system 900 communicate with each other as intended. Although internal bus subsystem 904 is shown schematically as a single bus, alternative embodiments of the bus subsystem can utilize multiple buses.

Network interface subsystem 916 can serve as an interface for communicating data between computer system 900 and other computer systems or networks (e.g., network 126 of FIG. 1). Embodiments of network interface subsystem 916 can include wired interfaces (e.g., Ethernet, CAN, RS232, RS485, etc.) or wireless interfaces (e.g., ZigBee, Wi-Fi, cellular, etc.).

User interface input devices 912 can include a keyboard, pointing devices (e.g., mouse, trackball, touchpad, etc.), a scanner, a barcode scanner, a touch-screen incorporated into a display, audio input devices (e.g., voice recognition systems, microphones, etc.), and other types of input devices. In general, use of the term "input device" is intended to include all possible types of devices and mechanisms for inputting information into computer system 900.

User interface output devices 914 can include a display subsystem, a printer, a fax machine, or non-visual displays such as audio output devices, etc. The display subsystem can be a cathode ray tube (CRT), a flat-panel device such as a liquid crystal display (LCD), or a projection device. In general, use of the term "output device" is intended to include all possible types of devices and mechanisms for outputting information from computer system 900.

Storage subsystem 906 can include a memory subsystem 908 and a file/disk storage subsystem 910. Subsystems 908 and 910 represent non-transitory computer-readable storage media that can store program code and/or data that provide the functionality of embodiments of the present invention.

Memory subsystem 908 can include a number of memories including a main random access memory (RAM) 918 for storage of instructions and data during program execution and a read-only memory (ROM) 920 in which fixed instructions are stored. File storage subsystem 910 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 900 is illustrative and not intended to limit embodiments of the present invention. Many other configurations having more or fewer components than system 900 are possible.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, although certain embodiments have been described with respect to particular process flows and steps, it should be apparent to those skilled in the art that the scope of the present invention is not strictly limited to the described flows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A method comprising:
  receiving, by one or more processors, load data from an energy generation (EG) system,
    wherein the load data corresponds to an amount of electrical power consumed by a site,
    wherein the load data is provided by a load meter, and
    wherein the load data corresponds to a predetermined time period;
  receiving, by the one or more processors, EG data from the EG system, wherein the EG data corresponds to an amount of electrical power generation by an EG circuit delivered to the site over the predetermined time period;

calculating, by the one or more processors, a correlation value based on a correlation between the load data and EG data;

determining, by the one or more processors, that the load meter is installed upstream from the EG circuit in response to determining that the calculated correlation value is indicative of an inverse relationship between the load data and EG data during the predetermined time period;

determining, by the one or more processors, that the load meter is installed downstream from the EG circuit in response to determining that the calculated correlation value is not indicative of an inverse relationship between the load data and EG data during the predetermined time period; and modifying, by the one or more processors, a load data-based measurement based on the determined installation location of the load meter.

2. The method of claim 1 wherein the predetermined time period is during daylight hours.

3. The method of claim 2 wherein the predetermined time period is between the hours of 10 AM and 2 PM.

4. The method of claim 1 wherein the correlation exists when a correlation coefficient is greater than 0.95.

5. The method of claim 4 wherein the correlation is caused by an increasing load data trend and a corresponding decreasing EG data trend.

6. The method of claim 4 wherein the correlation is caused by a decreasing load data trend and a corresponding increasing EG data trend.

7. The method of claim 6 wherein the increasing and decreasing trends are determined by calculating a difference between sampled values at different time periods.

8. The method of claim 7 wherein the trend is increasing if the difference is greater than zero.

9. The method of claim 7 wherein the trend is increasing if the difference is less than zero.

10. The method of claim 1 wherein the load data and EG data are a series of data points plotted with respect to time.

11. The method of claim 1 further comprising comparing the load data to the EG data.

12. The method of claim 1 wherein the load meter is a current transducer (CT).

13. The method of claim 1 wherein the EG data is photovoltaic (PV) data provided by a PV inverter.

14. A system comprising:
an energy generation (EG) system coupled to a utility grid;
a main panel coupled to the EG system;
a utility meter coupled to the main panel and the utility grid,
wherein the main panel includes a load meter;
a control server communicatively coupled to the load meter and the EG system, wherein the control server has one or more processors configured to:
receive load data from the EG system,
wherein the load data corresponds to an amount of electrical power consumed by a site,
wherein the load data is provided by a load meter, and
wherein the load data corresponds to a predetermined time period;
receive EG data from the EG system,
wherein the EG data corresponds to an amount of electrical power generation by an EG circuit delivered to the site over the predetermined time period;
calculate a correlation value based on a correlation between the load data and EG data;
determine that the load meter is installed upstream from the EG circuit in response to determining that the calculated correlation value is indicative of an inverse relationship between the load data and EG data during the predetermined time period; and
determine that the load meter is installed downstream from the EG circuit in response to determining that the calculated correlation value is not indicative of an inverse relationship between the load data and EG data during the predetermined time period.

15. The system of claim 14 wherein a site gateway communicatively couples the control server to at least both the load meter and the EG system.

16. The system of claim 14 wherein the load meter is communicatively coupled to the control server by a wireless connection.

17. The system of claim 14 wherein the main panel further includes a breaker box.

18. The system of claim 17 wherein the breaker box is located downstream from the load meter.

19. A computer-implemented method comprising:
one or more processors;
one or more non-transitory computer-readable storage mediums containing instructions configured to cause the one or more processors to perform operations including:
receiving load data from an EG system,
wherein the load data corresponds to an amount of electrical power consumed by a site,
wherein the load data is provided by a load meter, and
wherein the load data corresponds to a predetermined time period;
receiving EG data from the EG system,
wherein the EG data corresponds to an amount of electrical power generation by an EG circuit delivered to the site over the predetermined time period;
calculating a correlation value based on a correlation between the load data and EG data;
determining that the load meter is installed upstream from the EG circuit in response to determining that the calculated correlation value is indicative of an inverse relationship between the load data and EG data during the predetermined time period;
determining that the load meter is installed downstream from the EG circuit in response to determining that the calculated correlation value is not indicative of an inverse relationship between the load data and EG data during the predetermined time period; and
modifying a load data-based measurement based on the determined installation location of the load meter.

20. The computer-implemented method of claim 19, wherein the one or more processors are operatively coupled to the one or more non-transitory computer-readable storage mediums.

* * * * *